(12) United States Patent
Koukab et al.

(10) Patent No.: US 7,479,834 B2
(45) Date of Patent: Jan. 20, 2009

(54) ANALOGUE SELF-CALIBRATION METHOD AND APPARATUS FOR LOW NOISE, FAST AND WIDE-LOCKING RANGE PHASE LOCKED LOOP

(75) Inventors: Adil Koukab, Saint-Prex (CH); Michel Declercq, Penthaz (CH)

(73) Assignee: Marvell International Ltd., Hamilton (BM)

( * ) Notice: Subject to any disclaimer, the term of this patent is extended or adjusted under 35 U.S.C. 154(b) by 85 days.

(21) Appl. No.: 10/589,133

(22) PCT Filed: Feb. 4, 2005

(86) PCT No.: PCT/EP2005/050484

§ 371 (c)(1), (2), (4) Date: Aug. 11, 2006

(87) PCT Pub. No.: WO2005/081406

PCT Pub. Date: Sep. 1, 2005

(65) Prior Publication Data

US 2007/0040617 A1 Feb. 22, 2007

(30) Foreign Application Priority Data

Feb. 13, 2004 (EP) .................................. 04100600

(51) Int. Cl.
*H03L 7/093* (2006.01)

(52) U.S. Cl. .............................. 331/16; 331/17; 331/14; 327/157

(58) Field of Classification Search .................... 331/14, 331/16, 17, 18, 25, 175, DIG. 2; 327/156, 327/157

See application file for complete search history.

(56) References Cited

U.S. PATENT DOCUMENTS

| 5,521,947 | A | * | 5/1996 | Madsen ....................... 375/375 |
| 5,686,864 | A | | 11/1997 | Martin et al. |
| 5,942,949 | A | | 8/1999 | Wilson et al. |
| 6,496,075 | B2 | * | 12/2002 | Justice et al. .................. 331/11 |
| 6,525,609 | B1 | | 2/2003 | Behzad |
| 6,574,288 | B1 | | 6/2003 | Welland et al. |
| 6,747,521 | B1 | * | 6/2004 | Allott .......................... 331/175 |
| 2003/0048144 | A1 | | 3/2003 | Keller |
| 2003/0146794 | A1 | * | 8/2003 | Yamagishi et al. ............. 331/17 |
| 2004/0263259 | A1 | * | 12/2004 | Iadanza et al. ................. 331/16 |

* cited by examiner

*Primary Examiner*—Robert Pascal
*Assistant Examiner*—Ryan J. Johnson (57) ABSTRACT

A phase lock loop (PLL) frequency synthesizer includes a reconfigurable voltage controlled oscillator (VCO) with three modes of operation: a Linear-High-gain, Zero-gain, and Low-gain mode. During the linear high gain mode, the VCO enables an analogue self-calibration of the PLL over a wide frequency tuning range. Control voltage at the input of the VCO is varied by the PLL to provide an output frequency. When the PLL is locked, the VCO is switched to the Zero-gain mode while maintaining the output.

23 Claims, 6 Drawing Sheets

ANALOGUE SELF-CALIBRATION METHOD AND APPARATUS FOR LOW NOISE, FAST AND WIDE-LOCKING RANGE PHASE LOCKED LOOP

PRIORITY STATEMENT

This application is the national phase under 35 U.S.C. § 371 of PCT International Application No. PCT/EP2005/050484 which has an International filing date of Feb. 4, 2005, which designated the United States of America and which claims priority on European Patent Application number 04100600.8 filed Feb. 13, 2004.

BACKGROUND OF THE INVENTION

1. Field of the Invention

The present invention relates to a Phase Locked Loop (PLL) circuit having a variable output frequency. More particularly, the present invention consists of an improved method for a fast and automatic setting of the output frequency of PLL synthesizers that overcomes the classical problems associated with prior implementation, concerning: linearity, locking range limitation, settling time, jitter, phase noise, and spectral purity deterioration.

2. Description of the Prior Art

A Phase-Locked Loop (PLL) synthesizer is a circuit used to generate a periodic signal with a precise frequency. This kind of circuits is widely used in many communication and measurement products. Its application includes also advanced digital systems, such as microprocessors and micro-controllers. The PLL circuits should be designed with stringent constraints in term of noise performances, settling time, power consumption, locking range, integration, cost, etc.

Typically PLLs include a phase detector that compares the phase of the reference signal to the phase of an internal feedback signal, a charge pump and a low pass loop filter for setting an analogue voltage proportional to the detected phase difference, a Voltage-Controlled Oscillator (VCO) that generate a periodic output signal with a frequency proportional to its input voltage, and a frequency divider that generates the feedback signal after dividing the frequency of the output signal by a predefined integer or fractional number (N).

Two seemingly contradictory requirements constitute the fundamental forces driving the design of VCOs: On one hand, a wide frequency tuning range and thus a high VCO gain are needed to compensate temperature and process variation and to cover the frequency band of the considered application. At the same time, the gain of the VCO should be as small as possible to meet phase noise and spectral purity specifications. In fact, the more VCO has a high gain the more its sensitivity to the noise in its control path increases. The VCO control path is in general affected by several noise sources that include: charge pump noise, filter noise and ripple due to mismatching between the charge pump up and down currents. The noise in the signal path generated by the active elements of the VCO is also dramatically amplified and converted to the phase noise if the VCO gain is high.

Some approaches for simultaneously reducing the VCO gain and enabling a wide frequency range were recently presented as for example in U.S. Pat. Nos. 5,942,949, in 6,574,288 B1 and US2003 0119467 A1 patent documents. All these solutions consist in breaking the wide range tuning curve into several narrower-range sections with some frequency overlap. A digital calibration of a switched-capacitor network is used to choose the appropriate narrow-range section before starting an analogue fine frequency tuning over this curve.

Additional blocks are needed to build a second loop, which achieves the digital self-calibration of the VCO. The second loop is generally constituted by a phase/frequency detector, a charge pump followed by a capacitor or a digital accumulator, and a state machine that applies a sequence of digital control inputs values to the VCO. The complexity of those extra blocks increases proportionally to the needed accuracy of the output frequency. Moreover, since the consecutive digital control words (e.g. 11110 and 00001) can use totally different units of the switched-capacitor network, the accumulated capacitance errors due to process variation can reach very high values. Therefore, a very high frequency overlap is required to compensate these errors, leading to a higher gain of the VCO, a lower total tuning range, and a higher parasitic capacitance. This is why digital calibration can result in prolonged design cycles with a significant additional area and cost of the system.

This digital self-calibration is in general implemented with a simple algorithm such as sequential search as well as with more complex ones such as binary search. However, the time needed for those searching algorithms to achieve a fine resolution is often so high that only a coarse tuning or a self-calibration during the power up of the system is possible. Many side effects can affect the PLL output frequency during its on-mode such as temperature variation, power supply fluctuation, injection pulling etc. Therefore if the frequency varies significantly during the on-mode of the system, the PLL will not be able to correct this variation within a reasonable time. Moreover, The PLL settling time is one of the most important criteria for many applications. It is even the most critical figure for systems dedicated to fast frequency-hopped spread-spectrum, Ultra-Wideband, data recovery or time-multiplexed transceivers. Therefore, already at the top-level system design it would be desirable to avoid the classical scheme, where a digital calibration for the first coarse tuning of the frequency is used, followed by a continuous tuning for the final fine adjustment of the frequency. This classical scheme constitutes the basis of the methods described in the patent documents U.S. Pat. No. 6,574,288 B1 and US20030119467 A1. For the fine continuous tuning a reverse-biased diode, nMOS or pMOS varactor are typically used. However an integrated circuit is disclosed in U.S. Pat. No. 6,574,288 B1 and US2003 0119467 A1 enabling to avoid the use of these traditional varactors during the fine-tuning stage. In this circuit, capacitors with fixed values are used in an implementation where each capacitor is linked to a variable impedance device. The variable impedance devices are transistors having their gate controlled by a plurality of analogue signals. The equivalent capacitance of the circuit will be indirectly varied by varying the impedance the variable impedance devices. To avoid the abrupt nonlinear variation of the impedances an offset voltage is introduced between the control analogue signals. However, if a fast and fine resolution self-calibration technique is available, it will enable to be very close to the desired frequency. In this way the use of the noisy and cumbersome variable impedance devices, capacitors and their control circuitry can be avoided, and only a small varactor (pn junction, nMOS or PMOS) will be sufficient to achieve de final fine-tuning. Moreover, the gain of the VCO will be at its minimum during the operation of the system and the noise performances will be significantly improved.

SUMMARY OF THE INVENTION

The aim of the present invention is to provide a method and apparatus for a fast and automatic setting of the phase locked loop (PLL) output frequency over a wide tuning range, with a very low VCO gain during the in-lock state to improve the noise performances, and without using the costly, complex and time consuming digital self-calibration techniques.

This aim is achieved with a method for analogue self calibrating of a phase locked loop circuit comprising a phase frequency detector, a charge pump, a loop filter), a voltage controlled oscillator, including a plurality of VCO tuned elements, which output signal is compared with a reference signal frequency entering in the phase frequency detector characterized in that, the voltage controlled oscillator operating mode, using a linearized frequency versus voltage curve, is switched, in a first frequency tuning operation enabling a wide locking range, to a linear high gain mode, after locking to the appropriate frequency with the said first tuning operation, said voltage controlled oscillator operating mode is automatically switched to a zero-gain mode while keeping the frequency of said voltage controlled oscillator unchanged.

The sensitivity of the said voltage controlled oscillator to the noise in the control path is then practically eliminated and the phase noise performances significantly improved, and optionally, after said zero-gain mode, said voltage controlled oscillator operating mode is switched to a low gain mode enabling a fine tuning of the frequency by the phase locked loop for compensating small residual frequency errors and temperature variations.

The present invention concerns also an integrated circuit comprising a phase locked loop circuit including, a phase or frequency detector that compares the phase and frequency of a reference signal to the phase and frequency of an internal feedback signal and generates output error signals, a charge pump that generates amounts of charges proportional to said output error signals, a loop filter for setting an analogue voltage proportional to the charges accumulated in their capacitors, a voltage-controlled oscillator with multiples inputs corresponding each to a VCO tuned element characterized in that said phase locked loop circuit includes a gain mode switcher circuit connected between the loop filter output and the voltage-controlled oscillator inputs, enabling the voltage-controlled oscillator to work successively in a linear high-gain mode and a zero-gain mode; the gain mode switcher includes offsets generators circuits, a switch configuration and comparators; the offsets generators generate the voltages after shifting the loop filter output voltage with predefined offsets; the switch configuration apply the voltages of the offset generators to the inputs of the voltage-controlled oscillator during the linear high gain mode, isolates the inputs of the voltage-controlled oscillator from the offset generators and apply the output voltages of said offsets generators to the inputs of the comparators during the transition to zero gain mode, apply the resulting outputs voltages of said comparators to the inputs of the voltage-controlled oscillator, and finally freeze the state of each comparator and thus the frequency of the voltage-controlled oscillator making it independent on the loop filter output voltage, which constitute the zero-gain mode.

A VCO tuned element corresponds here either to a varactor (voltage controlled capacitor), to a voltage controlled current sources VCI or to any other voltage controlled component varying the frequency of the VCO. A set of these elements respectively constitutes a voltage-controlled oscillator VCO provided with several inputs as described below.

In general the present invention is a PLL-based frequency synthesizer having a reconfigurable VCO with three modes of operation: a Linear-High-gain, Zero-gain, and Low-gain mode. During a first tuning operation, a Gain-Mode Switcher sets the VCO in a high gain mode, enabling wide-locking range of the synthesizer with a fast settling time. During this operation, the control voltage of the VCO is varied by the PLL until the appropriate output frequency is found.

When the loop is locked, the VCO is automatically switched to Zero-gain mode by the Gain-Mode Switcher, while keeping the frequency of its output signal practically constant. Its sensitivity to the noise in the control path is then practically eliminated and its phase noise performances significantly improved. If the frequency error is sufficiently small for the considered application, the tuning is stopped at this stage. If the error is not sufficiently small the VCO is switched again to Low-gain mode and fine-tuning adjustment of the output frequency is achieved.

Another embodiment of the present invention is a method and apparatus for providing a linear variation of the frequency over all the voltage tuning range. The application of this method is particularly important during the High-gain mode, where the VCO gain variation may leads to serious degradation of the loop stability margin and the noise performances.

The present invention is not limited to charge-pump PLLs. As long as the circuit has a tuning system using a variable capacitance or a variable current, the reconfigurable three-mode (Linear-High-gain, Zero-gain, and eventually Low-gain) varactor (voltage controlled capacitor) or controlled current source using a Gain-Mode Switcher in accordance with the present invention, can be used for setting the desired value of the capacitance or the current.

BRIEF DESCRIPTION OF THE DRAWINGS

It is noted that the appended drawings illustrate only exemplary embodiments of the invention and are, therefore, not considered limiting of its scope.

DETAILED DESCRIPTION

Figure 1:
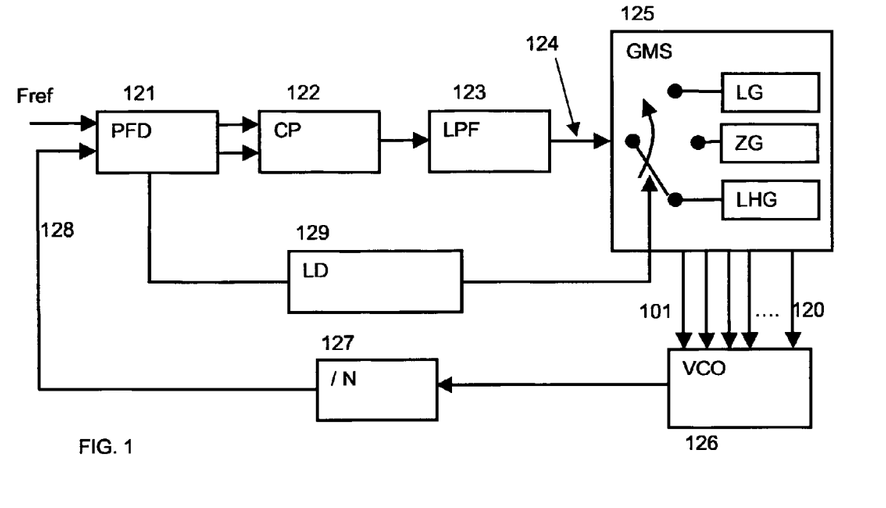
FIG. 1 illustrates a block diagram of a charge-pump phase locked loop system in accordance with the present invention.

FIG. 1 is a functional block diagram of the charge pump phase locked loop (PLL) system in accordance with the present invention. The PLL circuit, generally designed 100, includes a Phase/Frequency detector (PFD) 121 to compares the phase and the frequency of the reference signal (Fref) to the phase and the frequency of the feedback signal 128, and generates an error signal. The error signal is either an up signal or a down signal depending on the sign of the detected error.

Charge pump CP 122 generates an amount of charge equivalent to the error signal provided by the Phase/Frequency detector PFD 121. Depending upon the polarity of the signal (up or down), the charge is either added to or subtracted from a capacitor in the Low Pass Filter (LPF) 123. Accordingly, the low pass loop filter 123 generates a voltage 124 that will be applied to the input of the Gain-Mode Switcher 125 (GMS).

The Gain-Mode Switcher (GMS) 125 is the block of the PLL 100 that enables to change the gain mode of the VCO 126 during the tuning operations. Three operation modes are possible: A Linear-High-Gain mode (LHG-mode), Zero-Gain mode (ZG-mode), and Low-Gain mode (LG-mode). The Gain-Mode Switcher (GMS) 125 is composed on N parallel paths. N is equal to 19 in the exemplary Gain-Mode Switcher embodiment of FIG. 2. Each path includes an Offsets-Generator OG (e.g., 201) and a Switcher-Comparator SC (e.g., 221).

Figure 2:
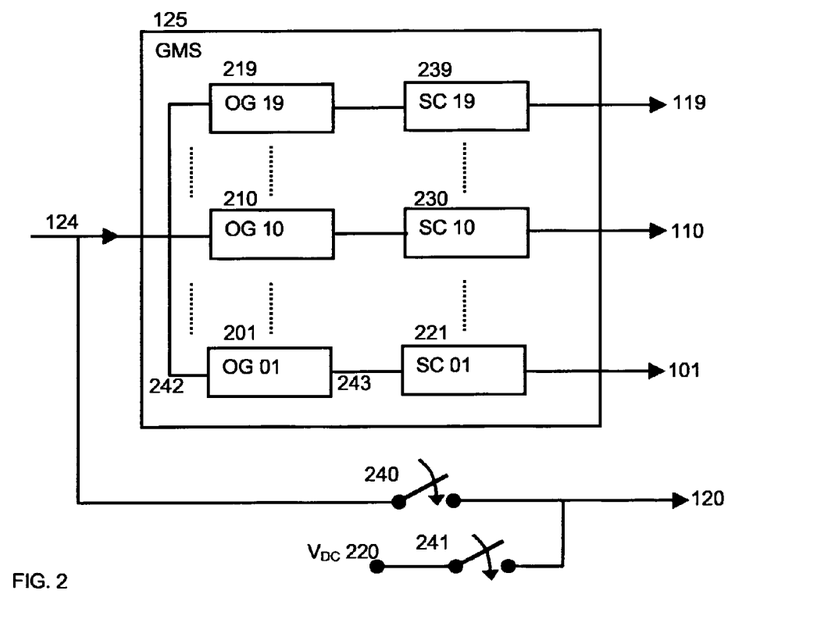
FIG. 2 diagrammatically shows the Gain-Mode Switcher incorporated into the PLL of FIG. 1.
Figure 3:
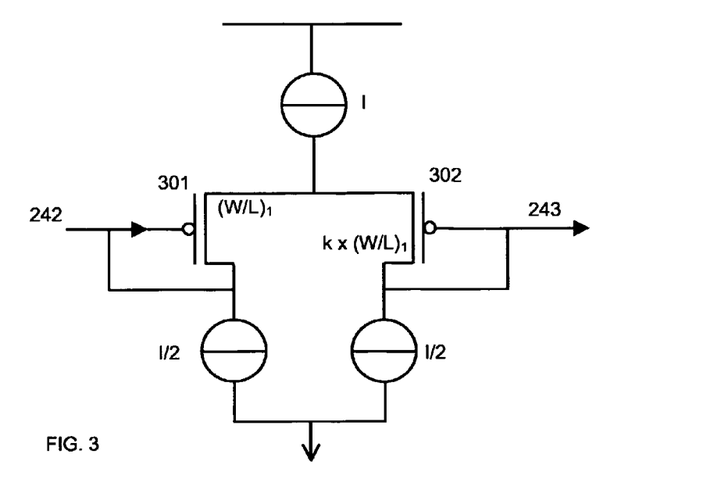
FIG. 3 diagrammatically shows an exemplary implementation of an offset-generator unit (e.g. 201) of the gain-mode switcher of FIG. 2.

Each Offset-Generator OG (e.g., 201) receives the voltage $V_t$ 124 at its input and generates an output voltage with an added offset, that is $V_t+\Delta V$ (e.g., 243). The values of the generated offsets will be varied from one Offset-Generator OG to the other by varying the dimensions of their components. FIG. 3 illustrates an exemplary embodiment of the Offset-Generator OG incorporated in Gain-Mode Switcher (GMS) 125. The dimensions $(W/L)_1$ and $(W/L)_2$ of transistors 301 and 302 are chosen in such way that $(W/L)_2$ is equal to $k \times (W/L)_1$. By changing the value of k, one can change the value of the offset $\Delta V$. The parameter k will be chosen either higher than 1 or lower than 1. The Offset-Generators OG with k higher than 1 will generate a positive offset and those with k lower than 1 will generate a negative offset. The output voltage of each Offset-Generator OG (e.g., 201) is applied to a Switcher-Comparator SC (e.g., 221).

Figure 4:
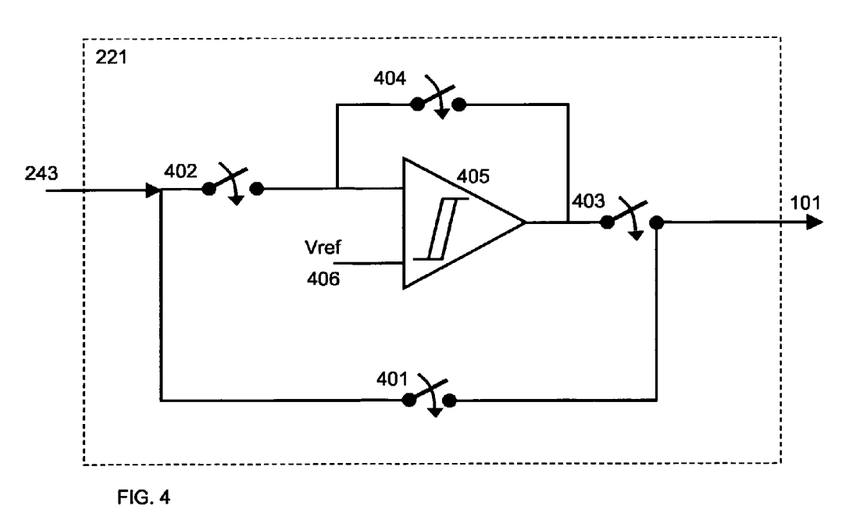
FIG. 4 diagrammatically shows an exemplary implementation of a switcher-comparator unit (e.g. 221) of the gain-switcher of FIG. 2.
Figure 5:
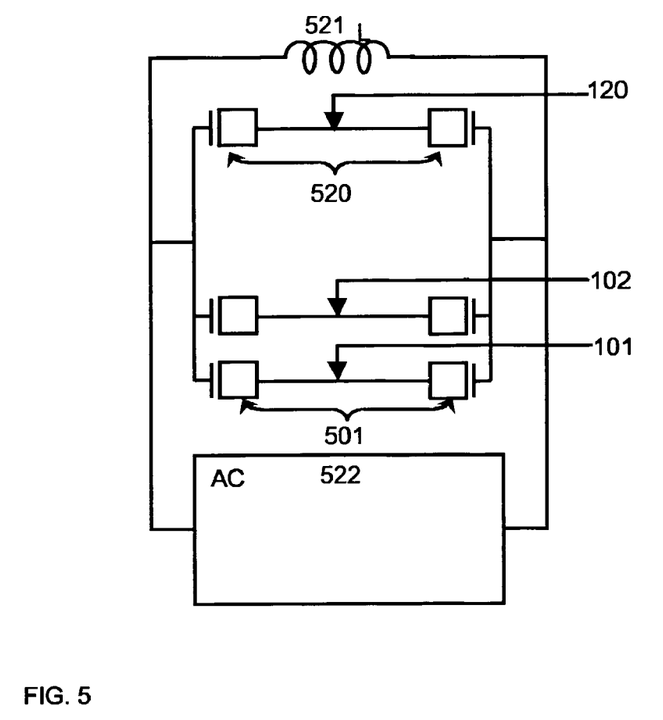
FIG. 5 illustrates an exemplary embodiment of a multi-inputs-VCO and their controlled elements in accordance with the present invention and which can be incorporated in the PLL of FIG. 1.

FIG. 4 shows an exemplary embodiment of a Switcher-Comparator SC unit of the Gain-Mode Switcher (GMS) 125. In the first tuning, the PLL is started in LHG-mode, each Switcher-Comparator SC (e.g., 221) of the Gain-Mode Switcher (GMS) 125 will enable to apply its input voltage $V_t+\Delta V$ (e.g., 243) directly to one of the inputs of the VCO (e.g., 101). After a first locking, the input voltage $V_t+\Delta V$ of each Switcher-Comparator SC will be compared to Vref 406, and its output switched to zero or to the power supply voltage Vcc depending upon the $V_t+\Delta V$ is higher or lower than Vref. In this example, Vref corresponds to the middle of the capacitance versus voltage characteristic of the used varactors (among 501 to 519). The capacitance of these varactors is thus switched to its maximum Cmax or to its minimum Cmin, depending upon its value was at Cmax or at Cmin when the PLL was locked at the end of the LHG-mode. By this operation the mode is switched to ZG-mode while keeping the total capacitance and so the output frequency unchanged.

The present invention can be applied on two types of PLL configuration:

a) The PLL with a capacitance controlled VCO, such as Inductance—capacitance LC oscillator, which is driven by a voltage varying a set of capacitances (varactors). This PLL is often used in radio-frequency (RF) applications for large frequency ranges. The main advantage of LC VCO is its low phase noise.

FIG. 5 shows an exemplary of the multi-inputs VCO incorporated in FIG. 1. This schematic is an embodiment of a modified inductance L—capacitance C VCO (LC VCO), which has several variable capacitors (e.g., 501 to 520 in FIG. 5). The values of these capacitors units 501 to 520 are controlled by input voltages 101-120 supplied by the Gain-Mode Switcher (GMS) 125. The output frequency of the VCO depends on both the value of the inductance 521 and the value of the capacitors 501 to 520. The active circuit AC 522 generates the required negative impedance for the circuit to oscillate.

b) The ring oscillator PLL, which is driven by a voltage varying a set of current sources. This PLL is preferably used in digital applications and/or at low frequency ranges. The main advantage is this type of PLL is its compactness and wide tuning range performance.

Figure 6:
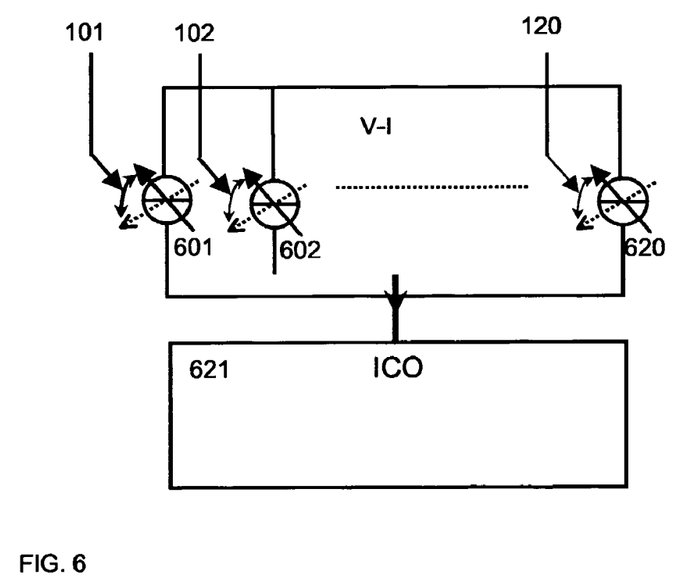
FIG. 6 illustrates another exemplary embodiment of a multi-inputs-VCO and their controlled elements in accordance with the present invention and which can be incorporated in the PLL of FIG. 1.

FIG. 6 shows an example of VCO using voltage controlled current sources (VCI) that can be incorporated in FIG. 1 to replace the LC VCO as shown in FIG. 5. The voltage controlled oscillator VCO is made by a current controlled oscillator ICO preceded by voltage—current V-I converters at each input. The values of the currents 601 to 620 generated by the converters are controlled by input voltages 101-120 supplied by the Gain Mode Switcher (GMS) 125. The output frequency of the oscillator depends then on the values of the currents 601 to 620. The ring oscillator 621 can be implemented with a cascade of differential buffer delay stages as well as with an odd number of inverters.

Figure 7:
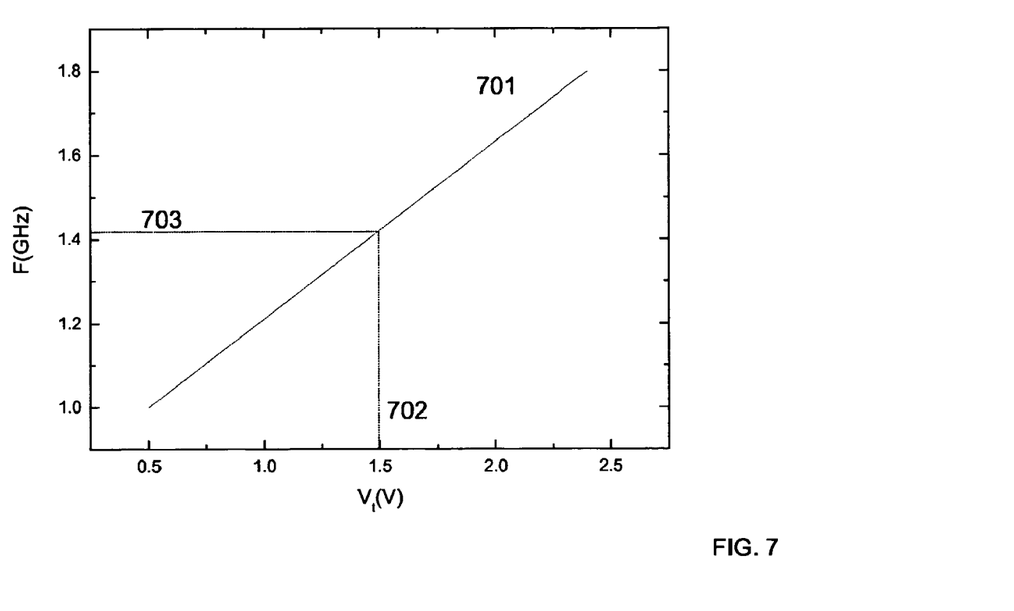
FIG. 7 shows a hypothetical frequency versus voltage characteristic needed for the considered application.

The present invention will be clarified with the help of the hypothetical application illustrated in FIG. 7. PLL's are often designed for a wide range of frequencies. The wide frequency tuning range is needed to compensate temperature and process variation and to cover the frequency band of the considered application. In the case of the application illustrated in FIG. 7, a frequency tuning range of 800MHz is needed. The PLL should be able to set any frequency in the band 1 GHZ to 1.8 GHz. The available tuning voltage is about 2 V (i.e., from 0.5 V to 2.5 V), thus, the needed VCO gain ($K_{VCO}$) is 400 MHz/V. It is well known that the operating curves (i.e., input voltage versus output frequency) of classical VCOs are in general highly non-linear. A variation of the gain $K_{VCO}$ will change the open-loop gain and hence change the loop bandwidth and phase margin. This is why in this hypothetical application of FIG. 7 a linear operating curve with a constant $K_{VCO}$ is targeted.

Figure 8:
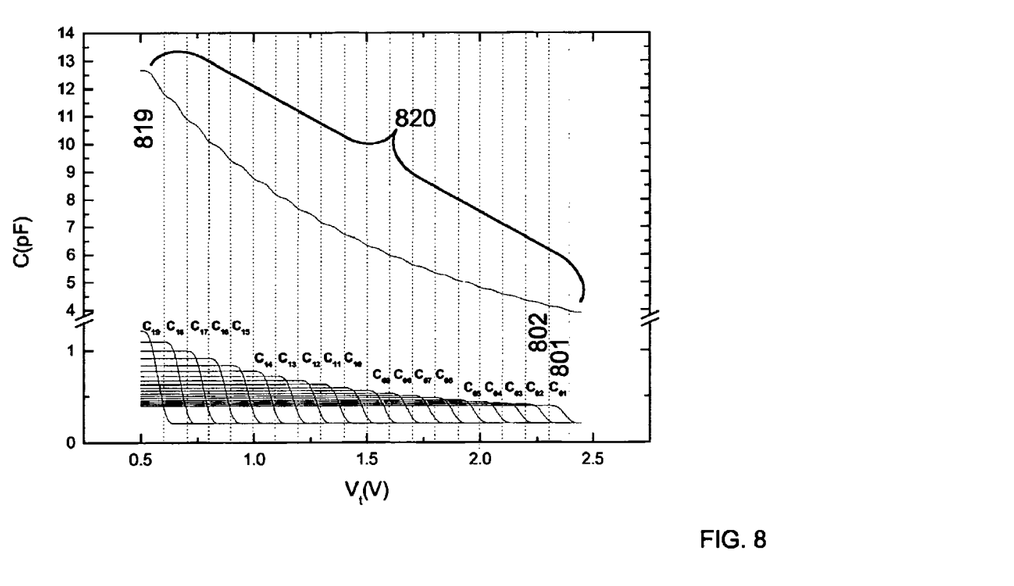
FIG. 8 the curve 820 shows a hypothetical capacitance versus voltage characteristic needed for the considered application, and C01 to C19 curves show the capacitance versus voltage curves used to build the curve. 1.

The curve 820 of FIG. 8 illustrates the needed capacitance versus voltage characteristic of the VCO varactor to produce the operating curve 701. 820 is deduced from 701 by using the well-known formula $2\pi F = (LC)^{-1/2}$, where F is the frequency of the VCO output signal, and L and C are respectively the equivalent parallel inductance (521) and capacitance (501-520) of the tank. To simplify the analysis, the fixed capacitance of the VCO is supposed to be negligible and its inductance 521 constant and equal to 2 nH. To built the wide-range curve 820, we start by breaking it into several narrower-range sections, 801 to 819. Each narrower-range section (e.g, 801) will be represented by an individual curve (e.g., $C_{01}$) having the same variation over the corresponding voltage interval (e.g., 0.1V in FIG. 8). As result, the curve 820 can be reconstituted entirely by a simple addition of the individual curves $C_{01}$ to $C_{19}$. Each one of the curves $C_{01}$ to $C_{19}$ will correspond to a given varactor among the varactors 501 to 519 of FIG. 5.

Figure 9:
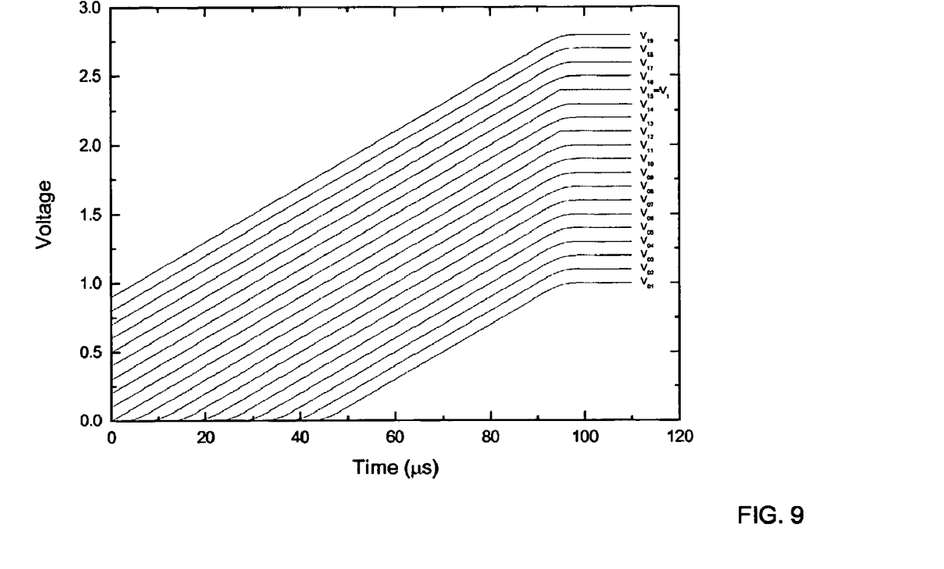
FIG. 9 curves V01 to V19 illustrate the output voltages of the offset generators implemented in the gain-mode switcher of FIG. 2. These output voltages are applied to the capacitors units 501 to 519 of the multi-inputs-VCO of FIG. 5.

The exemplary varactors 501 to 519 are MOS (Metal Oxide Semi-conductor) transistors, dimensioned in such way that there capacitance characteristics has respectively the same variation of $C_{01}$ to $C_{19}$. In the exemplary embodiments of FIG. 5 the control voltage 124 is applied to the MOS capacitors 515 and generates the operating curve $C_{15}$. To generate the other operating curves $C_{15\pm i}$, that is $C_{01}$ to $C_{15}$ curves, a tuning voltage with a various offsets are applied to the corresponding MOS capacitors. More precisely, to generate the curve $C_{15\pm i}$, a voltage $V_{15\pm i} = V_t \pm 0.1 \times i$ will be applied to the corresponding MOS capacitor. This voltage is one among the voltages $V_{01}$ to $V_{19}$ illustrated in FIG. 9, which illustrate the output voltages of the offset generators implemented in the gain-mode switcher Gain-Mode Switcher (GMS) 125 of FIG. 2. Therefore when those output voltages are directly applied to the MOS capacitors 501 to 519 of the multi-inputs VCO of FIG. 5, the PLL works in the LHG-mode and the resulting frequency versus tuning voltage curve is exactly the desired curve 701 of FIG. 7.

Figure 10:
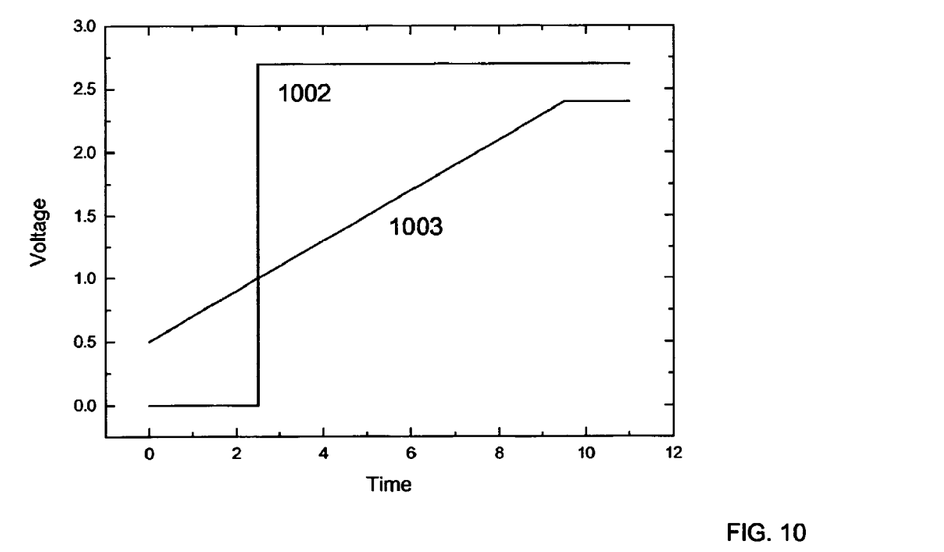
FIG. 10 illustrates the input 1003 and output 1002 voltage of the comparator 405 illustrated in FIG. 4.

FIG. 10 illustrates the input 1003 and output 1002 voltage of the comparator 405 of FIG. 4. The comparator compares its input signal 1003 with the reference voltage (Vref) 406 and switches the output voltage 1002 to zero or to Vcc depending upon the input voltage is higher or lower than Vref. Accordingly, when this output signal will be linked to the corresponding varactor 501 in ZG-mode, the capacitance will be switched to its maximum value or to its minimum value. As illustrated in FIG. 8, the gain of the characteristics $C_{01}$ to $C_{19}$ is practically zero in there maximum and minimum capacitance regions.

Figure 11:
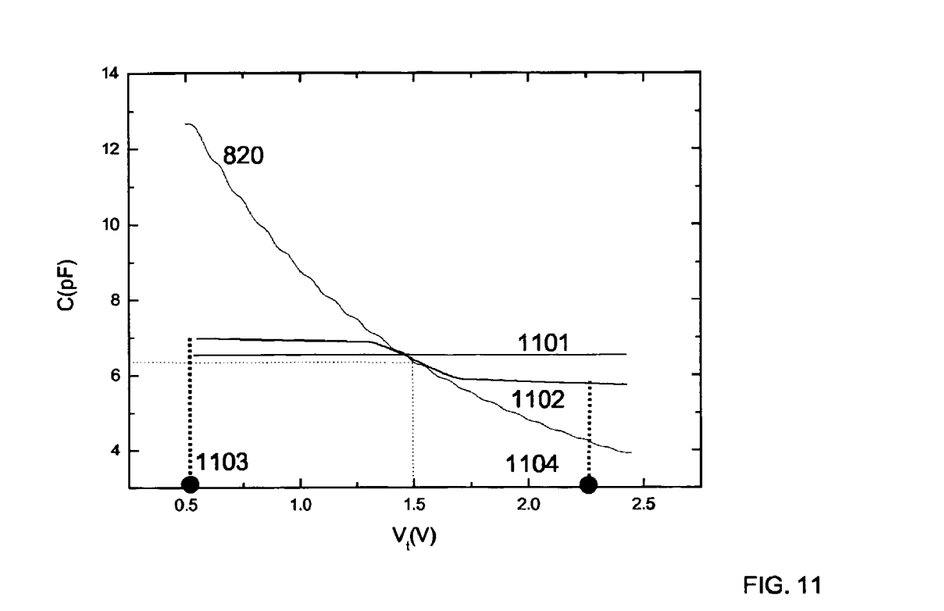
FIG. 11 illustrates the capacitance versus control voltage characteristics of the VCO, during linear-high-gain mode curve 820, zero-gain mode curve 1101, and low-gain mode curve 1102.

FIG. 11 illustrates the capacitance versus control voltage characteristics of the VCO, during linear-high-gain mode curve 820, zero-gain mode curve 1101, and low-gain mode curve 1102.

Figure 12:
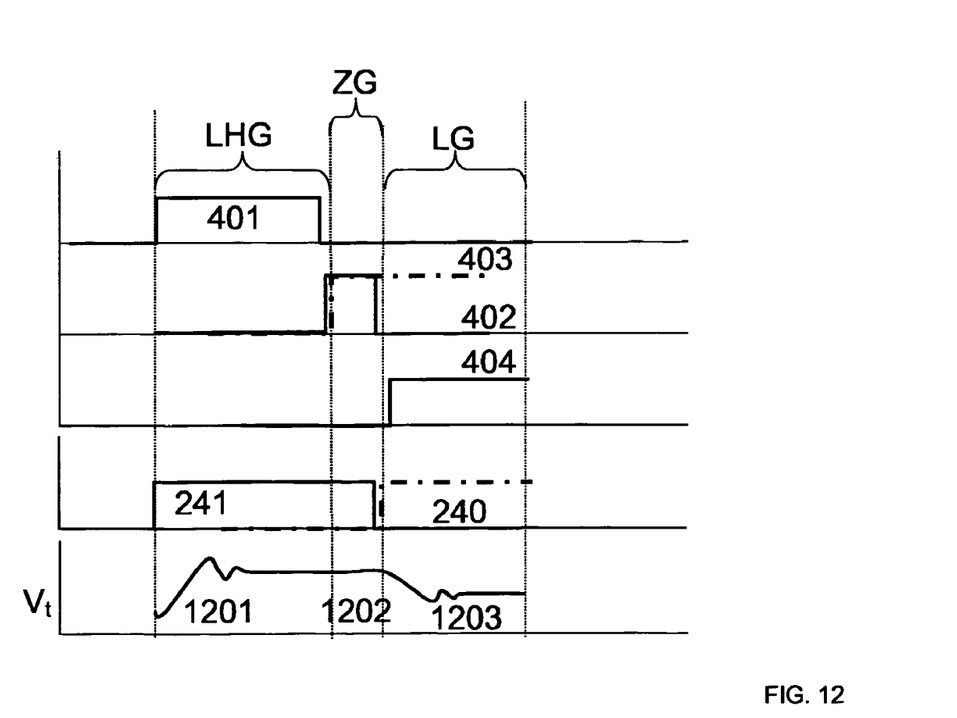
FIG. 12 diagrammatically shows the pattern of some internal signals of the PLL system of FIG. 1, and exemplary variations of control voltage (1201, 1202, 1203) during the loop settlings.

FIG. 12 diagrammatically shows the pattern of some internal signals of the PLL system 100, and exemplary variations of control voltage during the three modes of operations.

During a first tuning operation, the Gain-Mode Switcher (GMS) 125 sets the Multi-Inputs VCO 126 in the LHG-mode 1201. During this operation, switch 240 is open and 241 closed. Accordingly, the constant voltage $V_{dc}$ 220, is provided to varactor 520, freezing its capacitance in the middle of its capacitance versus voltage characteristic. On the other hand, switch 401 of each Switcher-Comparator SC (among 221-239) of the Gain-Mode Switcher (GMS) is closed while 402, 403, 404 are open. Accordingly, the outputs voltages of the Offsets-Generators OG 201-219 are directly provided to varactors 501 to 519. The phase frequency detector PFD 121 and the charge pump CP 122 will vary the control voltage 124 and thus, through the Offset-Generators OG 201-219, will also vary the voltages 201-219 according to the curves $V_{10}$-$V_{19}$ of FIG. 9. During this tuning operation, the frequency is varied according to the wide-range curve 701 until the appropriate value is found. In the given example $V_t$ 124 will be set to 1.5V (702) and output frequency to 1.42 GHz (703). The noise performance of the PLL is not critical at this stage. Therefore, in this mode the PLL can be optimized to be stable and have a fast settling time even if it will be at the cost of more noise. For this, a fraction of the filter capacitances can be optionally switched off and/or the current of the charge pump increased.

The duration of the LHG-mode 1201 is controlled by a Lock Detector LD 129. This mode is selected during a sufficiently long time for the loop to lock. When the control voltage 124 will converge to the needed value (e.g., 1.5 V 702), the Lock Detector LD send a signal to the Gain-Mode Switcher (GMS) and the VCO is switched to Zero-gain mode (ZG-mode in FIG. 12) by the Gain-Mode Switcher (GMS) 125, while keeping its frequency constant.

During the ZG-mode 1202 step, the switch 401 of each Switcher-Comparator SC among 221 to 239 is open, isolating the varactors 501-519 from the output voltages $V_{01}$-$V_{19}$ of Offset-Generators (OG) 201-219. At the same time switch 403 and 402 are closed. Voltages $V_{01}$-$V_{19}$ will thus be compared to Vref 406 by the comparator 405. Vref 406, is chosen to correspond to the middle of the capacitance versus voltage characteristic C15 of FIG. 8, which corresponds to varactor 515 (e.g., Vref>>0.95 V). The output of 405 will then be switched to zero or to Vcc depending upon the input voltage is higher or lower than Vref. Accordingly, the capacitance of the varactors 501-519 will be switched to its maximum value or to its minimum value. To freeze the situation and to make it independent on future variations of the control voltage 124, switch 402 is opened and 404 is closed. The capacitance of the thank 501-519 are thus frozen and correspond to a constant capacitance (e.g., operating curve 1101), which is independent on Vt 124. The sensitivity to the noise in the control path is then practically eliminated and the phase noise performances of the PLL 100, significantly improved. At this stage, the equivalent output frequency of the VCO is equal to the desired frequency (e.g., 1.42 GHz 703) with a small error. The error can be reduced by increasing the number of fractions in FIG. 8 and thus increasing the number of VCO varactors in FIG. 5. If the frequency error is sufficiently small for the considered application the tuning is stopped.

If the error is not sufficiently small the VCO is switched to Low-Gain (LG) mode 1203. Switch 241 is opened and switch 240 is closed. The tuning voltage 124 is than applied to an additional varactor 520, and fine-tuning adjustment over operating curve 1102 is achieved.

Optionally, comparators are added to the Gain-Mode Switcher (GMS) 125 to set an upper and a lower limit for its input signal 124. Accordingly, these comparators will control the value of the signal 124. If during LG-mode 1203, this signal reaches either of the upper limit 1104 or the lower limit 1103, a Gain-Mode Switcher (GMS) 125 will be restarted, and LHG-mode 1201 is selected again. The limits are preferably set near Vcc for the upper (1104) and near zero for the lower (1103). This operation is useful if the fine-tuning range is not sufficiently wide to compensate frequency variation that can arise during LG-mode 1203. This frequency variation can be caused by a rise in the chip temperature for instance.

To preserve the stability of the PLL in both LHG-mode and LG-mode, the product of the charge pump CP 122 current and the gain of the VCO 126 will be kept constant. Therefore, a fraction of the charge pump CP current will be switched off during LHG-mode 1201 and switched on during LG-mode 1203. Optionally, a fraction of the filter capacitance is switched off during LHG-mode 1201, resulting in significant improvement of the PLL settling time at the cost of a worst noise performance. In fact, the noise performance becomes critical only in the final LG-mode.

Another option particularly suitable for low voltage applications is to add a voltage doubler circuit that increase the voltage supply of the charge pump (CP), the loop filter and the offsets generators (OG) during the linear high-gain mode (LHG) and hence enhance the tuning range of the PLL. A switch configuration enabling the isolation of the noisy voltage doubler during the low gain (LG) mode and the application instead, the low noise output operating voltage supply is optionally added to save PLL spectrum purity.

The forgoing description has been presented for the purposes of illustration and description. It is not intended to be exhaustive or to limit the invention to the exemplary embodiments disclosed, and obviously many modifications and variations are possible in light of the above teaching. For example, the LHG-mode can be implemented with a single input VCO, controlled by a single analog voltage without using any offset generator. The varactors 501 to 519 will be controlled by the same signal. A circuit will be added to change the threshold voltages of the varactors and thus to enable their capacitance to vary exactly as the curves $C_{01}$-$C_{19}$ of FIG. 8. The switching to the ZG-mode will be achieved by comparing the single control voltage to a plurality of reference voltages and decide for each varactor if it will be set to its maximum value or to its minimum value.

In addition, further modifications and alternative embodiments of this invention will be apparent to those skilled in the art in view of this description. For example, the analogue self-calibrating method whish consist on using a linear high gain mode to adjust the frequency and switch to zero gain mode to improve the noise performances, can be used in a successive approximation procedure. The PLL will use successive LHG-mode/ZG-mode stages; in each stage the specified gain of the LHG-mode will be lower than in the precedent stage. By this procedure the tuning will converge successively toward the desired frequency. Therefore, it is to be understood that the forms of the invention herein shown and described are to be taken as exemplary embodiments. Various modifications and alternative embodiments can be used without departing from the scope of the present invention.

The invention claimed is:

1. Method for analogue self calibrating of a phase locked loop circuit including a phase frequency detector, a charge pump, a loop filter, a voltage-controlled oscillator, including elements tuned by a tuning voltage, the method comprising:
   comparing a frequency of an output signal of the voltage-controlled oscillator of the phase locked loop circuit with a reference signal frequency entering in the phase frequency detector;
   switching a voltage-controlled oscillator operating mode to a linear-high-gain mode to enable a first frequency tuning operation that includes targeting a linear frequency versus voltage curve to vary the frequency of the output signal within a frequency locking range;
   after locking to a frequency with said first frequency tuning operation, switching said voltage-controlled oscillator operating mode to a zero-gain mode while keeping the frequency of the output signal unchanged;
   generating a control voltage based on said comparing of said output signal and said reference signal; and
   offsetting said control voltage to generate an output voltage,
   wherein the tuning voltage is generated based on said output voltage and a reference voltage.

2. Method according to claim 1 further comprising:
   breaking the required linear frequency versus voltage curve into several sections over either constant or non-constant voltage intervals;
   selecting for each section a corresponding element tuned by the tuning voltage giving the same frequency variation over said section; and
   submitting each element tuned by the tuning voltage to a specific voltage, deduced from a loop filter output voltage, to activate each element in the same voltage interval as the corresponding section of each element.

3. Method according to claim 1, wherein the switching operation of the voltage-controlled oscillator from the linear-high-gain mode to the zero-gain mode comprises:
   isolating the elements tuned by the tuning voltage from respective controlling voltages when the phase locked loop is locked;
   comparing each element tuned by the tuning voltage to a reference voltage to determine if the value of each element is at a maximum or a minimum when the phase locked loop is locked;
   depending on the result of this comparison, switching each element value to the maximum or to the minimum; and
   freezing the elements tuned by the tuning voltage in the state previously obtained to activate the zero-gain mode for the voltage-controlled oscillator.

4. Method according to claim 1, wherein phase locked loop locking time during the linear-high-gain mode is adjusted by switching off a portion of the loop filter or by increasing a current of the charge pump.

5. The method of claim 1 wherein said voltage-controlled oscillator maintains a constant gain when operating in said linear-high-gain mode.

6. The method of claim 1 wherein said voltage-controlled oscillator maintains a constant frequency versus voltage relationship based on said linear frequency versus voltage curve to maintain a constant gain when operating in said linear-high-gain mode.

7. The method of claim 1 further comprising generating the tuning voltage to maintain a constant gain and a constant frequency versus voltage relationship based on said linear frequency versus voltage curve.

8. The method of claim 1 wherein said zero-gain mode comprises maintaining a constant capacitance in said voltage-controlled oscillator.

9. Integrated circuit comprising a phase locked loop circuit including:
   a detector to compare phase and frequency of a reference signal to phase and frequency of an internal feedback signal and to generate output error signals,
   a charge pump to generate amounts of charges proportional to said output error signals,
   a loop filter to set an analogue voltage proportional to charges accumulated in capacitors and based on said amounts of charges,
   a voltage-controlled oscillator with inputs that each correspond to an element tuned by a tuning voltage, and
   a gain mode switcher circuit connected between an output of the loop filter and the inputs, to enable the voltage-controlled oscillator to work successively in a linear high-gain mode and a zero-gain mode, the gain mode switcher circuit including:
      offset generators to generate output voltages after shifting an output voltage of the loop filter with predefined offsets,
      comparators, and
      a switch configuration to apply the output voltages of the offset generators to the inputs of the voltage-controlled oscillator during the linear-high-gain mode, to isolate the inputs of the voltage-controlled oscillator from the offset generators and to apply the output voltages of said offset generators to inputs of the comparators during transition to the zero-gain mode, to apply the resulting outputs voltages of said comparators to the inputs of the voltage-controlled oscillator and to freeze the state of each comparator and output frequency of the voltage-controlled oscillator making the output frequency independent of the output voltage of the loop filter during the zero-gain mode.

10. Integrated circuit comprising a phase locked loop circuit according to claim 9, wherein the elements tuned by the tuning voltage include varactors dimensioned such that the voltage-controlled oscillator has a constant voltage to frequency gain during the linear-high-gain mode, and wherein each of the varactors is controlled by a corresponding input of the voltage-controlled oscillator.

11. Integrated circuit comprising a phase locked loop circuit according to claim 10, wherein the voltage-controlled oscillator further comprises an additional varactor for fine frequency tuning during the low-gain mode and a switch configuration that enables the application of a constant voltage to said additional varactor during the linear-high-gain mode and the zero-gain mode, and the application of the output voltage of the loop filter to said additional varactor during the low-gain mode.

12. Integrated circuit comprising a phase locked loop circuit according to claim 9, wherein the voltage-controlled oscillator includes a current controlled oscillator which includes elements tuned by the tuning voltage comprising voltage to current converters including voltage controlled current sources dimensioned such that the current controlled oscillator has a constant voltage to frequency gain during the linear-high-gain mode, each of the voltage controlled current sources controlled by a corresponding input of the voltage-controlled oscillator.

13. Integrated circuit comprising a phase locked loop circuit according to claim 12, wherein each of the elements tuned by the tuning voltage further comprises an additional controlled current source that enables fine frequency tuning during the low-gain mode and a switch configuration that enables application of a constant voltage to said voltage controlled current sources during the linear-high-gain mode and the zero-gain mode, and the application of the output voltage of the loop filter to said additional controlled current source during the low-gain mode.

14. Integrated circuit comprising a phase locked loop circuit according to claim 9, further comprising a lock detector that activates the switch configuration such that: the linear-high-gain mode is selected during a time period for the phase lock loop circuit to lock onto a frequency,
wherein the transition to the zero-gain mode is activated after the phase lock loop circuit is locked.

15. Integrated circuit comprising a phase locked loop circuit according to claim 11, further comprising comparators that set an upper and a lower limit for the loop filter output voltage during the low-gain mode and restart the initial linear-high-gain mode when said loop filter output voltage reaches either of these two limits.

16. Integrated circuit comprising the phase locked loop circuit according to claim 9, further comprising a voltage doubler circuit that Increases the voltage supply of the charge pump, the loop filter and the offset generators during the linear high-gain mode and that adjusts a tuning range of the phase locked loop circuit.

17. Integrated circuit comprising the phase locked loop circuit according to claim 16, further comprising a switch configuration enabling the application of the voltage doubler circuit to the charge pump, the loop filter and the offset generators during the linear high-gain mode.

18. Method for analogue self calibrating of a phase locked loop circuit including a phase frequency detector, a charge pump, a loop filter, a voltage-controlled oscillator, including elements tuned by a tuning voltage, the method comprising:
comparing a frequency of an output signal of the voltage-controlled oscillator of the phase locked loop circuit with a reference signal frequency entering in the phase frequency detector;
switching a voltage-controlled oscillator operating mode to a linear-high-gain mode to enable a first frequency tuning operation that includes targeting a linear frequency versus voltage curve to vary the frequency of the output signal within a frequency locking range; and
after locking to a frequency with said first frequency tuning operation, switching said voltage-controlled oscillator operating mode to a zero-gain mode while keeping the frequency of the output signal unchanged,
wherein, after said zero-pain mode, said voltage-controlled oscillator operating mode is switched to a low-pain mode enabling fine tuning of the frequency of the output signal by the phase locked loop circuit to compensate for residual frequency errors and temperature variations, and
wherein the switching operation of the voltage-controlled oscillator from the zero-gain mode to the low-gain mode comprises:
using an additional element tuned by the tuning voltage that is dimensioned for fine tuning with a low voltage-controlled oscillator gain;
linking said additional element tuned by the tuning voltage to a fixed voltage during the linear-high-gain mode and the zero-gain mode;
isolating said additional element from the fixed voltage during switching from the zero-gain mode to the low-gain mode; and
linking said additional element to the tuning voltage that is supplied by the loop filter of the phase locked loop.

19. Method for analogue self calibrating of a phase locked loop circuit including a phase frequency detector, a charge pump, a loop filter, a voltage-controlled oscillator, including elements tuned by a tuning voltage, the method comprising:
comparing a frequency of an output signal of the voltage-controlled oscillator of the phase locked loop circuit with a reference signal frequency entering in the phase frequency detector;
switching a voltage-controlled oscillator operating mode to a linear-high-gain mode to enable a first frequency tuning operation that includes targeting a linear frequency versus voltage curve to vary the frequency of the output signal within a frequency locking range; and
after locking to a frequency with said first frequency tuning operation, switching said voltage-controlled oscillator operating mode to a zero-gain mode while keeping the frequency of the output signal unchanged,
wherein, after said zero-gain mode, said voltage-controlled oscillator operating mode is switched to a low-gain mode enabling fine tuning of the frequency of the output signal by the phase locked loop circuit to compensate for residual frequency errors and temperature variations, and
wherein a loop filter output voltage of the phase locked loop circuit is compared to an upper and a lower limit by means of additional comparators during the low-gain mode; and tuning operations are restarted and the linearhigh-gain mode is selected when the loop filter output voltage reaches either of the upper limit or the lower limit.

20. Method for analogue self calibrating of a phase locked loop circuit including a phase frequency detector, a charge pump, a loop filter, a voltage-controlled oscillator, including elements tuned by a tuning voltage, the method comprising:

comparing a frequency of an output signal of the voltage-controlled oscillator of the phase locked loop circuit with a reference signal frequency entering in the phase frequency detector;

switching a voltage-controlled oscillator operating mode to a linear-high-gain mode to enable a first frequency tuning operation that includes targeting a linear frequency versus voltage curve to vary the frequency of the output signal within a frequency locking range; and after locking to a frequency with said first frequency tuning operation, switching said voltage-controlled oscillator operating mode to a zero-gain mode while keeping the frequency of the output signal unchanged, wherein, after said zero-gain mode, said voltage-controlled oscillator operating mode is switched to a low-gain mode enabling fine tuning of the frequency of the output signal by the phase locked loop circuit to compensate for residual frequency errors and temperature variations, and wherein the phase locked loop stability during the linear-high-gain and the low-gain modes is preserved by decreasing the current of the charge pump during the linear-high-gain mode and by increasing the current of the charge pump during the low-gain mode such that a product of the current of the charge pump and gain of the voltage-controlled oscillator remains constant.

21. Method for analogue self calibrating of a phase locked loop circuit including a phase frequency detector, a charge pump, a loop filter, a voltage-controlled oscillator, including elements tuned by a tuning voltage, the method comprising:

comparing a frequency of an output signal of the voltage-controlled oscillator of the phase locked loop circuit with a reference signal frequency entering in the phase frequency detector;

switching a voltage-controlled oscillator operating mode to a linear-high-gain mode to enable a first frequency tuning operation that includes targeting a linear frequency versus voltage curve to vary the frequency of the output signal within a frequency locking range;

after locking to a frequency with said first frequency tuning operation, switching said voltage-controlled oscillator operating mode to a zero-gain mode while keeping the frequency of the output signal unchanged;

generating a control voltage based on said comparing of said output signal and said reference signal; and offsetting said control voltage to generate an output voltage based on said linear frequency versus voltage curve, wherein the tuning voltage is generated based on said output voltage and a reference voltage.

22. Method for analogue self calibrating of a phase locked loop circuit including a phase frequency detector, a charge pump, a loop filter, a voltage-controlled oscillator, including elements tuned by a tuning voltage, the method comprising:

comparing a frequency of an output signal of the voltage-controlled oscillator of the phase locked loop circuit with a reference signal frequency entering in the phase frequency detector;

switching a voltage-controlled oscillator operating mode to a linear-high-gain mode to enable a first frequency tuning operation that includes targeting a linear frequency versus voltage curve to vary the frequency of the output signal within a frequency locking range;

after locking to a frequency with said first frequency tuning operation, switching said voltage-controlled oscillator operating mode to a zero-gain mode while keeping the frequency of the output signal unchanged;

generating a control voltage based on said comparing of said output signal and said reference signal;

varying offset of said control voltage to generate a plurality of output voltages; and generating a plurality of tuning voltages based on said plurality of output voltages and a reference voltage.

23. Method for analogue self calibrating of a phase locked loop circuit including a phase frequency detector, a charge pump, a loop filter, a voltage-controlled oscillator, including elements tuned by a tuning voltage, the method comprising:

comparing a frequency of an output signal of the voltage-controlled oscillator of the phase locked loop circuit with a reference signal frequency entering in the phase frequency detector;

switching a voltage-controlled oscillator operating mode to a linear-high-gain mode to enable a first frequency tuning operation that includes targeting a linear frequency versus voltage curve to vary the frequency of the output signal within a frequency locking range; and after locking to a frequency with said first frequency tuning operation, switching said voltage-controlled oscillator operating mode to a zero-gain mode while keeping the frequency of the output signal unchanged, wherein said zero-gain mode comprises:

comparing an offset control voltage to a reference voltage; and setting the tuning voltage to one of a plurality of voltage potentials based on said comparing.

* * * * *

UNITED STATES PATENT AND TRADEMARK OFFICE
CERTIFICATE OF CORRECTION

PATENT NO. : 7,479,834 B2  Page 1 of 1
APPLICATION NO. : 10/589133
DATED : January 20, 2009
INVENTOR(S) : Adil Koukab et al.

It is certified that error appears in the above-identified patent and that said Letters Patent is hereby corrected as shown below:

| | |
|---|---|
| Column 2, Line 58 | Insert -- of -- after "impedance" |
| Column 2, Line 66 | Delete "PMOS" and insert -- pMOS -- |
| Column 2, Line 67 | Delete "de" |
| Column 4, Line 26 | Delete "leads" and insert -- lead -- |
| Column 5, Line 19 | Delete "to" after "121" |
| Column 6, Line 6 | Delete "was" after "value" |
| Column 7, Line 5 | Delete "built" and insert -- build -- |
| Column 7, Line 10 | Insert -- a -- after "As" |
| Column 7, Line 16 | Delete "there" and insert -- their -- |
| Column 7, Line 27 | Delete first occurrence of "gain mode switcher" |
| Column 7, Line 37 | Insert -- whether -- after "upon" |
| Column 7, Line 42 | Delete "there" and insert -- their -- |
| Column 7, Line 64 | Delete "$V_{10}$" and insert -- $V_{01}$ -- after "curves" |
| Column 8, Line 11 | Delete "send" and insert -- sends -- |
| Column 8, Line 24 | Insert -- whether -- after "upon" |
| Column 8, Line 30 | Delete "thank" and insert -- tank -- |
| Column 8, Line 43 | Delete "than" and insert -- then -- |
| Column 9, Line 28 | Delete "whish" and insert -- which -- |
| Column 11, Line 61 | Delete "Increase" and insert -- increases -- |
| Column 12, Line 20 | Delete "zero-pain" and insert -- zero-gain -- |
| Column 12, Line 21 | Delete "low-pain" and insert -- low-gain -- |

Signed and Sealed this

Nineteenth Day of May, 2009

JOHN DOLL
*Acting Director of the United States Patent and Trademark Office*